United States Patent
Huignard

[11] 3,947,189
[45] Mar. 30, 1976

[54] OPTICAL DATA PROJECTION DEVICE

[75] Inventor: Jean Pierre Huignard, Paris, France

[73] Assignee: Thomson-CSF, Paris, France

[22] Filed: July 23, 1974

[21] Appl. No.: 491,139

[30] Foreign Application Priority Data
July 27, 1973   France .............................. 73.27572

[52] U.S. Cl. ..................... 353/38; 353/122; 350/3.5
[51] Int. Cl.² ......................................... G03B 21/14
[58] Field of Search ......... 353/38, 82, 122; 350/3.5, 350/167

[56] References Cited
UNITED STATES PATENTS

| | | | |
|---|---|---|---|
| 2,186,123 | 1/1940 | Rautsch .............................. | 353/38 |
| 3,437,804 | 4/1969 | Schaefer ............................. | 353/82 |
| 3,515,452 | 6/1970 | Pole .................................... | 350/3.5 |
| 3,658,414 | 4/1972 | Fukushima ......................... | 353/38 |
| 3,692,380 | 9/1972 | Inagaki ............................... | 350/3.5 |
| 3,785,736 | 1/1974 | Spitz ................................... | 350/3.5 |
| 3,838,904 | 10/1974 | Takeda ............................... | 350/3.5 |

*Primary Examiner*—Richard E. Aegerter
*Assistant Examiner*—A. Jason Mirabito
*Attorney, Agent, or Firm*—Cushman, Darby & Cushman

[57] ABSTRACT

An optical device for concentrating in a plane a radiation modulated by an object, carrying data. It comprises a mask splitting an incident beam into a plurality of elementary beams, and two stigmatic systems, the first of which for focussing and the second for converging the elementary beams into a predetermined zone, which is the image of the source of the incident beam; the modulating object comprises elementary zones bearing said data, these zones being arranged in the path of the elementary beams.

7 Claims, 3 Drawing Figures

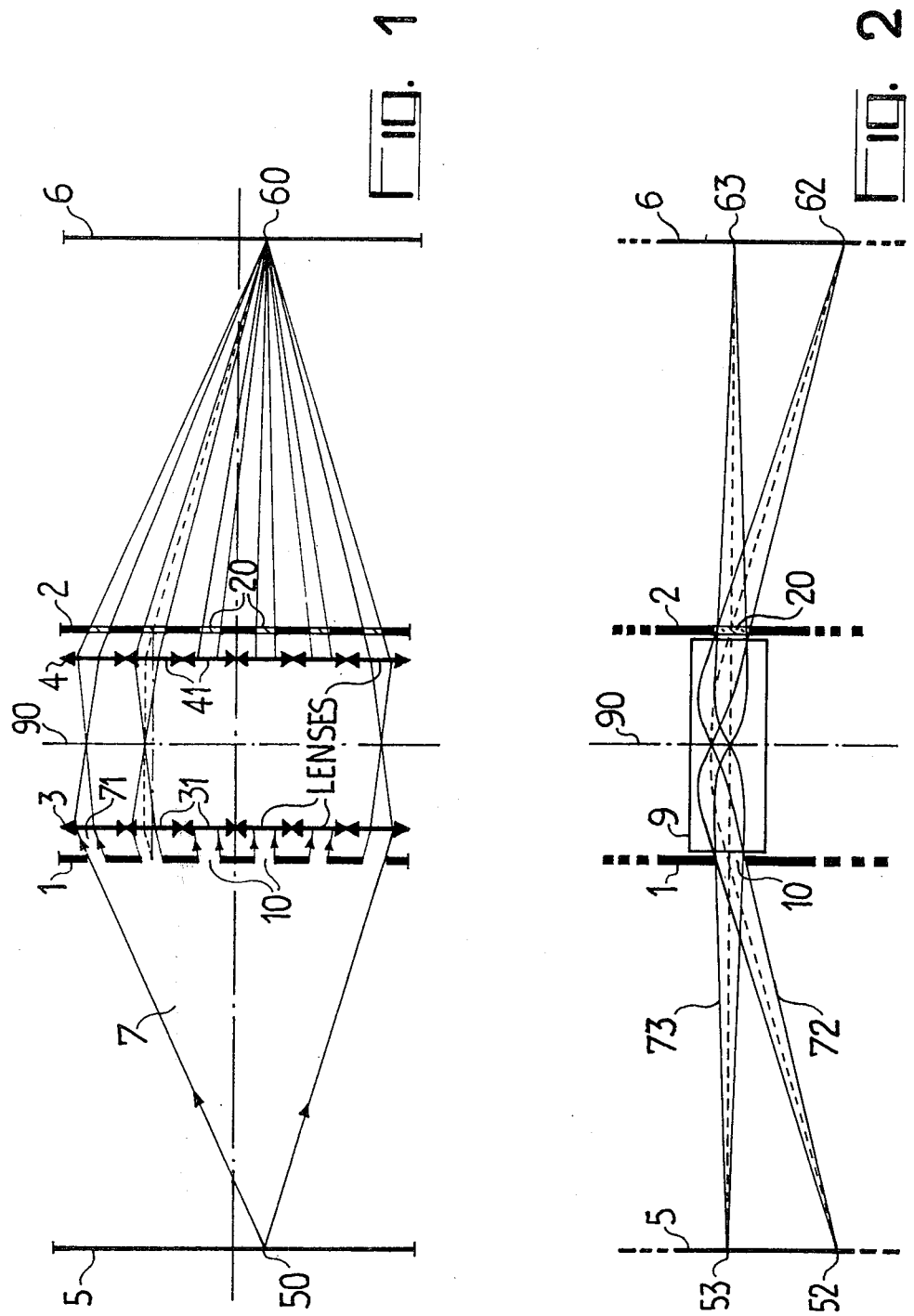

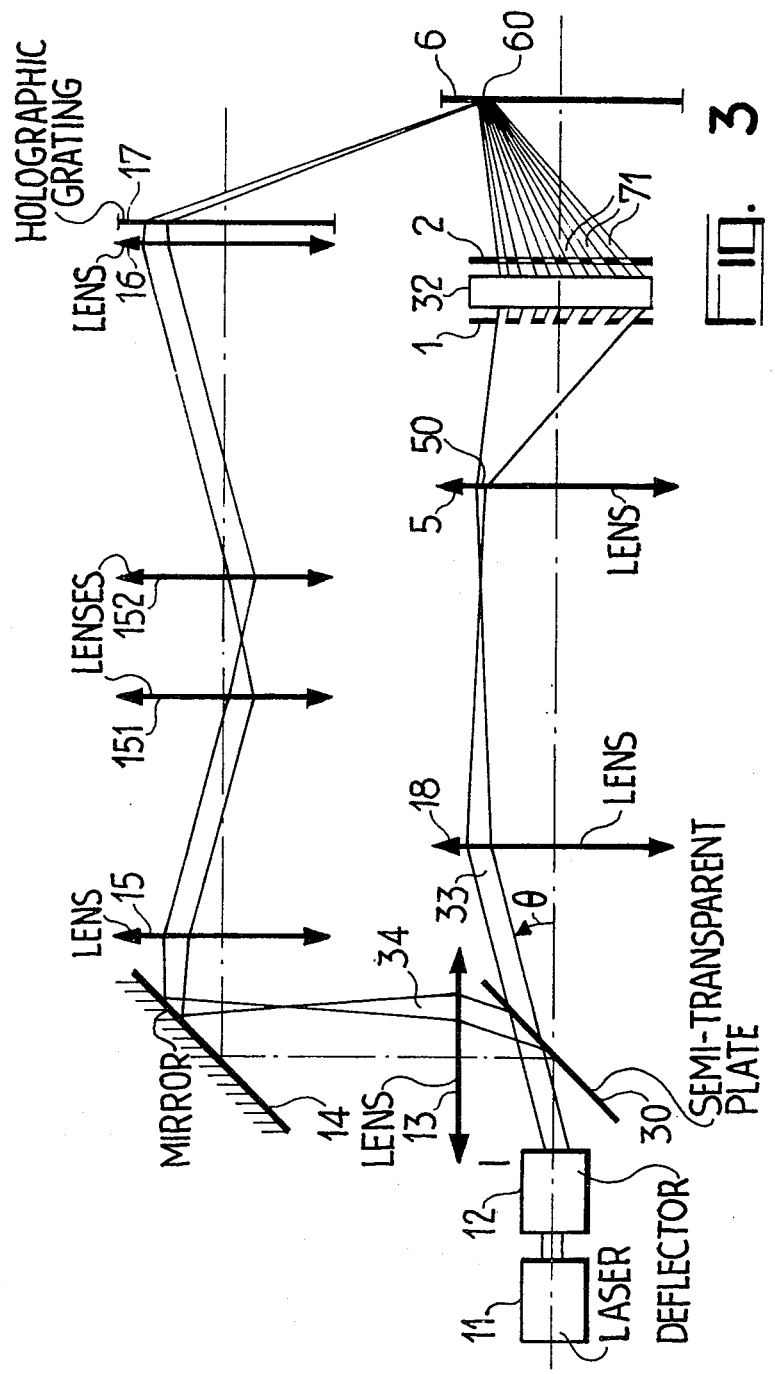

OPTICAL DATA PROJECTION DEVICE

The present invention relates to an optical device which makes it possible to concentrate in a plane, a modulated radiation emerging from a data carrier of non-uniform transparency playing the part of modulator object, and relates also to its application to a holographic store recording system.

An object of this kind is conventionally achieved using a light source which emits a divergent beam, and an objective lens arranged in the immediate proximity of the modulator object, in order to cause the radiation issuing from said source to converge in a data storage plane. The image of the source is thus converted into a diffraction pattern representing the spectrum of the frequencies of the modulation created by the non-uniform transparency of the modulator object.

In certain applications, in particular in large capacity holographic stores, on the one hand the radiation source is located in a plane parallel to the object and, on the other hand, the data carrier is given a very large area, the capacity of this kind of store being directly linked to the area of the object and to the extent of the zone in which the source is located. This obviously requires a large-diameter objective lens with a large aperture and a substantial angle of view; the practical design of such a lens comes up against prohibitive technical obstacles, due to the nature of the aberrations which have to be corrected.

The object of the invention is an optical data projection device, which makes it possible to avoid this difficulty by breaking up the divergent beam designed for illuminating the modulator object and the lenses, into a plurality of elementary beams having the same phase centre, whose convergence in the data storage plane is successively brought about with the help of two stigamtic optical systems arranged in cascade.

In accordance with the present invention, there is provided an optical data projection device comprising:

a light source, capable of occupying a plurality of positions in an entry plane of said device and furnishing an incident beam;

a frame located on an object plane, arranged in the path of said incident beam, a modulator object, carrying said data, being introduced in said frame when the device is on operation;

an exit plane onto which said projection is effected;

stigmatic means which enable the optical conjugation of said entry and exit planes, said stigmatic means comprising two successive stigmatic optical systems, the first of which having for its conjugate planes said entry plane and a focussing intermediate plane, located between said two stigmatic systems, and the second of these systems having for its conjugate planes said intermediate plane and exit plane.

For a better understanding of the invention and to show how the same may be carried into effect, reference will be made to the following description and the attached figures among which:

FIG. 1 illustrates an embodiment of the device in accordance with the invention;

FIG. 2 is a fragmentary view of a variant embodiment of the device;

FIG. 3 is an example of the application of the device.

In all these figures, similar references are used to designate similar elements.

FIG. 1 is a sectioned diagram of the device in accordance with the invention.

It comprises, illuminated by a light source 50, a mask 1, assemblies of adjacent lenses 3 and 4 and a frame designed to hold a modulator object 2. The source 50 has by way of example been illustrated as a point source; it belongs to a plane 5 referred to as the entry plane of the device and perpendicular to the plane of the figure, and supplies a divergent beam 7. The mask 1 is a screen containing N openings 10; it will for example be substantially parallel to the plane 5; it makes it possible to split the incident beam into N beams (71) known as elementary beams.

The first lens matrix (3) is constituted by N identical, elementary, convergent lenses 31 of focal length $f$, arranged in the same plane parallel to the preceding planes (5 and 1); the matrix 3 is arranged at a distance $f$ from the mask 1. This matrix 3 constitutes a first stigmatic system in respect of which the plane conjugate with the entry plane 5, is an intermediate plane 90 on which each of the elementary beams 71 are focused.

The second matrix of lenses (4) is constituted in a similar way by elementary, convergent lenses 41, preferably identical to the lenses 31. This second matrix 4 is designed to cause each of the elementary beams 71, previously focused in the intermediate imediate plane 90, to converge a second time in a plane 6 referred to as the exit plane of the device and parallel to the preceding planes; this point of convergence is in the neighbourhood of a point 60 which is the image of the source 50. This second matrix constitutes a second stigmatic system in respect of which the intermediate plane 90 and the exit plane 6 are conjugate planes.

The modulator object 2 is constituted by elementary zones 20 of non-uniform transparency, representing the information or data to be projected; these elementary zones are arranged in such a fashion and provided in such number, that despite the splitting of the incident beam 7 by the mask 1, all the zones 20 are illuminated. In FIG. 1, a simple embodiment has been shown in which the zones 20 number N, arranged in the plane 2 in the same way that the openings 10 are arranged in the mask 1, the plane 2 being arranged behind the matrix 4 at a distance $f$. It will be remembered that the distance between the two matrices 3 and 4, which is equal to $2p'$, is given by $$\frac{1}{p'} + \frac{1}{p} = \frac{1}{f}$$

where $p$ is the distance between the entry plane 5 and the matrix 3; generally speaking, the distance $p$ will be given a large value compared with $f$ and this, for the distance between the matrices, yields a value in the order of $2f$. The N lenses 31, the N lenses 41, the N openings 10 and the N zones 20 are arranged in such a fashion in relation to one another that the openings, lenses and zones 20 are substantially coaxial with each other; thus, N optical assemblies are obtained each made up of a lens 31 and a lens 41 whose optical axis is at right angles to the planes 5 and 6.

A variant embodiment, which has not been shown, consists in providing in the portion of the surface of the object plane 2 located between the zones 20, similar zones carrying data to which access can be had after a lateral deflection either of the light beams or of the object itself, and which can be exploited in the same fashion as the information stored in the zones 20.

Ultimately, then, with the help of the device described above, projection of the data carried by the object 2 onto the exit plane 6 is obtained, with the advantage over the known systems, that it is possible to utilise lenses of small size and medium quality, this of itself creating a substantial technological simplification.

FIG. 2 illustrates a variant embodiment of the invention in which the matrices of lenses are replaced by pieces of optic-fibres 9 with a non-uniform refractive index. In the diagram, an elementary beam such as one of the beams 71 of FIG. 1, has been picked out, and two of its contours 72 and 73 are shown in accordance with the position of the source, respectively at 52 and 53, in the entry plane 5. Also shown are fragments of the mask 1 and the object 2 as well as the element 9 transmitting this elementary beam and arranged between said two planes (1 and 2), perpendicularly to them, at the level of an opening 10 and an elementary zone 20.

The elements 9 are each constituted by a piece of glass fibre which makes it possible to guide a light beam and whose refractive index varies in accordance with the distance from the axis of symmetry of the element. An embodiment of such an element is commercially marketed under the registred Trade Mark SELFOC; this is a cylindrical element whose refractive index varies radially in accordance with a parabolic law.

The two contours (72 and 73) of light beams passing through the section of fibre 9, illustrated by way of example in FIG. 2, show how this piece of fibre performs the same function as an assembly of elementary lenses 31–41, belonging to the matrices 3 and 4 of FIG. 1 and causing the beams 72 and 73 to converge in the exit plane 6 at points 62 and 63 which are images of the sources 52 and 53: in other words, the first half of the fibre 9 can constitute the first stigmatic system and the second half the second stigmatic system, the plane 90 being one of the plane of symmetry of the piece of fibre 9.

In order to provide a complete device, it is merely necessary to arrange between the mask 1 and the object 2, a matrix of N pieces of fibres 9 whose axes of symmetry are disposed parallel to one another.

FIG. 3 illustrates an application of the device in accordance with the invention to a holographic store recording system.

The recording system illustrated by way of example in the figure is constituted in a conventional manner, by:

a coherent light source 11, such as a laser;

a light deflector 12 causing a beam issuing from the source 11 to undergo an angular deflection θ;

a semi-transparent plate 30 which makes it possible to split the beam into an object beam 33 and a reference beam 34;

a convergent lens 13, a mirror 14, a convergent lens 15, an assembly of two convergent lenses 151 and 152 reversing the angle of deflection of the reference beam 34, an objective lens 16 and a holographic grating 17, designed to cause the reference beam 34 to converge in the exit plane 6;

an objective lens 18 and an objective lens marked 5 since it constitutes the entry plane of the projection device;

the device in accordance with the invention, illustrated by its entry plane 5, the mask 1, the two stigmatic systems schematically represented by an element 32 and constituted by one or the other of the embodiments hereinbefore described, the modulator object 2, and the various elementary beams 71 converging in the exit plane 6 at the point 60.

This system operates in a conventional way, as described for example in U.S. application Ser. No. 395,080: a plate of photosensitive material is arranged in the exit plane 6; the deflector 12 causes the light beam to undergo deflection through an angle θ corresponding to a determinate zone 60; the latter is then simultaneously illuminated by the object beam (33) and the reference beam (34), enabling holographic recording of the data carrier by the object 2, in the zone 60. It should be pointed out, however, that in this system, the device in accordance with the invention, between its entry (5) and exit (6) planes, subjects the object beam (33) to a positive magnification equal to +1.

What I claim is:

1. An optical data projection device comprising: an entry plane; a light source, capable of occupying a plurality of positions in said entry plane, said light source furnishing an incident beam of radiant energy; an object plane arranged in the path of said incident beam; a frame lying in said object plane for receiving a modulator object carrying said data; an exit plane arranged for receiving said radiant energy upon being transmitted across said frame; and stigmatic imaging means positioned between said entry plane and said exit plane for optically conjugating said entry plane and said exit plane; said stigmatic imaging means comprising two successive stigmatic optical systems separated from one another by a focussing intermediate plane, the first of said stigmatic optical systems optically conjugating said entry plane and said focussing intermediate plane; and the second of said stigmatic optical systems optically conjugating said focussing intermediate plane and said exit plane.

2. A device as claimed in claim 1, wherein said entry plane is substantially parallel to said exit plane; each of said stigmatic optical systems being constituted by a planar matrix arrangement of adjacent, convergent lenses having the same focal length; said planar matrix arrangement being substantially parallel to said entry and exit planes said stigmatic imaging means including a plurality of similar elementary imaging channels; each of said elementary imaging channels having an axis substantially at right angle to said entry and exit planes, and being constituted by aligning one lens pertaining to said first stigmatic optical system with one lens pertaining to said second stigmatic optical system.

3. A device as claimed in claim 1, wherein said stigmatic optical systems are constituted by a matrix arrangement of optical fiber members having a non-uniform refractive index; the optical axes of said optical fiber members being arranged substantially at right - angle to said entry and exit planes; each of said optical fiber members extending symmetrically on each side of said focussing intermediate plane for respectively forming said first and second stigmatic optical systems.

4. A device as claimed in claim 2, further comprising a mask arranged in one focal plane of said stigmatic optical systems; said mask being constituted by an opaque screen substantially parallel to said entry plane and comprising openings in the neighbourhood of the axes of said elementary imaging channels; said mask splitting said incident beam into elementary beams having a common phase centre.

5. A device as claimed in claim 3, further comprising a mask arranged in one focal plane of said stigmatic optical systems; said mask being constituted by an opaque screen substantially parallel to said entry plane and comprising openings in the neighbourhood of the axes of said optical fiber members; said mask splitting said incident beam into elementary beams having a common phase centre.

6. A device as claimed in claim 4, wherein said mask is positioned between said entry plane and said stigmatic imaging means.

7. A device as claimed in claim 5, wherein said mask is positioned between said entry plane and said stigmatic imaging means.

* * * * *